United States Patent

[11] 3,615,480

[72] Inventor Frank Man-Kam Lam
East Brunswick, N.J.
[21] Appl. No. 801,740
[22] Filed Feb. 24, 1969
[45] Patented Oct. 26, 1971
[73] Assignee E. I. du Pont de Nemours and Company
Wilmington, Del.

[54] DEVELOPER SOLUTIONS FOR PHOTOPOLYMERIZED LAYERS
6 Claims, No Drawings

[52] U.S. Cl. .......... 96/48, 252/62.1, 96/115
[51] Int. Cl. .......... G03c 5/24
[50] Field of Search .......... 252/364, 62.1; 156/13; 96/48, 115 P

[56] References Cited

UNITED STATES PATENTS

| | | | |
|---|---|---|---|
| 3,252,800 | 5/1966 | Smith | 96/115 |
| 3,475,171 | 10/1969 | Alles et al. | 96/35.1 |

*Primary Examiner*—Norman G. Torchin
*Assistant Examiner*—Richard E. Fichter
*Attorney*—Lynn Barratt Morris

ABSTRACT: An aqueous developer comprising an alkali metal silicate having a silica to alkali metal oxide ratio greater than 1.5 and one or more water-miscible organic solvents having a pH of 10.0–13.0 and capable of removing all the unexposed areas of a photopolymerizable layer containing an ethylenically unsaturated monomer of a printing form.

DEVELOPER SOLUTIONS FOR PHOTOPOLYMERIZED LAYERS

BACKGROUND OF THE INVENTION

Description of the Prior Art

The use of photopolymerizable compositions and layers, particularly photopolymerizable printing plats and films, is increasing in the graphic arts industry. The photopolymerizable layers comprise addition polymerizable ethylenically unsaturated monomers and macromolecular polymers in liquid, gel or solid form such as those described in Alles, U.S. application Ser. No. 560,889, June27, 1966 abandoned, but photopolymerizable subject matter first refiled as continuation-in-part application, Ser. No. 690,732, Dec. 15, 1967, U.S. Pat. No. 3,458,311, July 29, 1968. The layers are usually coated on a flexible or rigid support of organic polymer film or metal, e.g., ferrous metal and aluminum sheets or plates. Unlike earlier photomechanical printing plates involving light-sensitive diazo compounds and combinations thereof, the addition photopolymerizable systems contain a macromolecular organic polymer and an addition polymerizable monomer containing at least one terminal ethylenic group $$(CH_2{=}C\langle)$$

that forms a high-molecular-weight polymer upon exposure to actinic radiation. When the photopolymerizable layer is exposed, the solubility of the layer is affected whereby the exposed areas become hardened and insoluble. Although exposure and subsequent development may yield an image, photopolymer lithographic printing plates sometimes exhibit certain defects because of the developer solution.

Inadequate development or the use of unsuitable solutions may result in inefficient development or partial removal of the formed image, as well as the background area. In the instance of alkaline developers, metal supports, if not treated with a special protective layer before coating, may become oxidized. Oxidation of the background areas leads to "scumming" or undesirable inking in the nonimage areas. Also, pH and developer efficiency decrease with long storage. Various polymer and developer modifications are necessary to significantly improve the systems. In some instances, said deleterious effects are reduced by incorporation of special agents in the polymer or special precoating or postpolymerization treatments. Nevertheless, proper development or fixation are determinant factors in the achievement of desired printing plate results.

Exposed photopolymerizable layers may then be developed by aid of the aqueous alkali metal phosphates, silicates, or metasilicates so described in U.S. Pats. to Sus et al. No. 3,199,981, Aug. 10, 1965, and Reichel No. 3,264,104, Aug. 2, 1966. Plambeck, No. 2,760,863 discloses an aqueous developer system wherein the solution is of opposite polarity to that of the photopolymerized stratum, i.e., an acidic layer would require an aqueous alkaline developing system. Plambeck suggests but discourages use of certain organic solvents and mixtures thereof which dissolve the unexposed areas of the layer but do not appreciably effect the exposed areas. Assignee's copending application, Alles, U.S. Ser. No. 690,730, filed Dec. 15, 1967, U.S. Pat. No. 3,458,311 discloses aqueous developers for photopolymerizable layers comprising alkalis, e.g., alkali metal hydroxides, carbonates, phosphates, metasilicates, etc., and one or more organic solvents. Said developer compositions may comprise between 1 and 50 percent by volume or organic solvents and have pH values between 8 and 13. Nevertheless, Alles does not suggest use of alkaline agents with silica to caustic oxide ratios greater than 1 to 1 in combination with organic solvent (s) to eliminate the aforementioned defects.

SUMMARY OF THE INVENTION

This invention comprises an aqueous developer composition for photopolymerizable lithographic elements having an alkali metal silicate of respective silica to caustic oxide ratio 1.5 or more and a water-miscible organic solvent(s), said aqueous solution having a pH between 10.0 and 13. The aqueous developer composition comprises 0.5 or more by weight of the weight of the aforesaid alkali metal silicate and from 2 to 25 percent by volume of organic solvent(s), said solution having a pH between 10.0 and 12. It may contain additional ingredients, e.g., surface active wetting agents, colorants, buffering agents, etc.

DESCRIPTION OF THE PREFERRED EMBODIMENTS

This invention relates to aqueous alkaline developer solutions capable of developing exposed lithographic printing plates having photopolymerizable layers thereon. Said developer solutions essentially comprise an alkali metal silicate with a $SiO_2$ to $M_2O$ where M is Na or K, of 1.5 or more and one or more water-miscible organic solvents in combination in the proportions given above. The solutions may contain colorants, surfactants, buffers, sequestering agents, etc. The developer solutions can be used in treating polymerizable layers like those described in Alles, U.S. Ser. No. 690,730, filed Dec. 15, 1967. Additional applicable photopolymerizable printing compositions are described in Assignee's Jeffers, U.S. Ser. No. 664,280, filed Aug. 30, 1967, Chambers, U.S. Ser. No. 688,703, filed Dec. 7, 1967, U.S. Pat. No. 3,479,185, Nov. 18, 1969, related British Patent specification 1,135,280, and Chang et al., U.S. Ser. No. 731,733, filed May 24, 1968, U.S. Pat. No. 3,558,322, Jan. 26, 1971.

As disclosed above, the alkali metal silicates should be employed in sufficient amount to produce a pH between 10.0 and 13. In particular, those alkali silicates having silica to alkali metal or caustic oxide ratios greater than 1.5 and more to 1 and capable of producing a solution of pH between 10.5 and 12 are most suitable. Said amount is to be not less than 0.5 percent by weight in the working strength aqueous developer solution. More precisely, those silicates having the general formula:

$$x\, SiO_2 \cdot y\, M_2O$$

wherein M is an alkali metal such as sodium, lithium, or potassium. The coefficients $x$ and $y$ indicate the respective mole concentrations of silica (silicon dioxide) and caustic oxide.

In the instance of the present invention, the developer system comprises an aqueous solution wherein a silicate of the above-indicated general formula with $x>y$, or more preferably, $x \geq 2y$, an organic solvent(s) in combination with conventional ingredients. Commercial silicates of this type are available with silica to caustic oxide ratios as high as 8.5 to 1. Such commercial compositions are the sodium silicates (3.85 to 1), potassium silicate (4.0 to 1), and the lithium silicates (4.8–8.50 to 1). Said commercial products may be obtained as concentrates with various proportions of water, e.g., $Na_20 \cdot 3.75\ SiO_2 \cdot x\ H_2O$, $2.1\ SiO_2 \cdot K_20^{O} \cdot 5H_2O$, $2.5\ SiO_2 \cdot K_20 \cdot H_2O$, $8.5\ SiO_2 \cdot {}_20 \cdot 9\ H_2O$, etc. The hydrated compositions of said silicates are more soluble than those of the anhydrous form. However, alkaline silicates having ratios of silica less than or equal to that of caustic oxide such as $3Na_2\ 0.2\ SiO_2 \cdot H_2O$, $2Na_20SiO_2$, $K_2Si_2O_5$, $Na_2SiO_3$, etc., are not useful in accordance with the invention. Instead, only the preferred silicates and the organic solvents in combination therewith are capable of effectively providing good protection against oxidation of metal surfaces and good pH stability. The organic solvents should not have a deleterious effect on the photopolymerized areas of the layers or on the surfaces of the supports.

The preferred organic solvents are water-miscible, capable of dissolving the photopolymerizable material, and compatible with the alkali metal silicate agent. The organic solvent is used in a concentration sufficient to swell the unexposed photopolymerizable material without softening the polymer image. Organic substances, particularly suitable for use in the developing system described herein, are the low-molecular-weight aliphatic alcohols, ketones, ethers or mixtures thereof. Condensed multiple component solvents such as the monoalkyl and dialkyl ethers of ethylene glycol and their derivatives are also applicable in the developer system disclosed herein. Said low-molecular-weight solvent compositions comprise a chain structure of one to four carbon atoms in addition to the functional group. However, the condensed solvents of the compositions may comprise up to ten carbon atoms. Accordingly, compounds such as ethanol, butanol, methyl ethyl ketone, diethyl ketone, methyl ethyl ether, ethylene glycol monobutyl ether, etc., are added to the developer at a preferred concentration between 2 and 25 percent of the total aqueous developer volume. With certain solvents, it may be desirable to add compounds which produce a pleasant odor. In the instance, wherein color-producing agents or any optional ingredients are employed, concentrations are adjusted so as to not appreciably effect developer efficiency or produce any deleterious effects on the photopolymerized material.

When used in developing machines, certain silicates may precipitate and form "scale" on inadequately rinsed parts of the equipment. This flaky insoluble accumulation which requires additional maintenance may be reduced with commercial water-softeners or sequestering agents such as sodium hexametaphosphate, ethylenediamine tetracetic acid, diethylenetriaminepentacetic acid, etc. Because of greater solubility or reduced adherence to the parts of the machine, lithium salts do not produce the "scale" characteristic of sodium and potassium silicates.

Because the properties of particular alkali metal silicates differ, one or more of the preferred silicates and organic solvent(s) may be admixed with suitable alkaline, buffering agents, etc., to function as a multipurpose developer. Accordingly, a modification comprising a 50/50 mixture of preferred lithium and sodium silicates, organic solvents, and conventional ingredients provides adequate development of the polymerized layer, reduces "scaling" and provides adequate oxidation protection. Such a solution provides an effective, economical system for preventing scaling during machine processing. In a similar manner, a potassium silicate of higher silica content may be admixed with a preferred sodium silicate to increase compatibility with the organic solvent(s).

In using combined silicate solutions, it is required only that the amount of a particular component necessary to achieve a desired function without appreciably reducing developing efficiency be employed. More precisely, it is necessary that the silica to caustic oxide ratio of 1.5 or more to 1 be sustained. Additional ingredients may be included, however, the aqueous multiple silicate solution should have a pH between 10.0 and 13.

Various buffering agents may be added to the aqueous solution, e.g., sodium or potassium hydroxides, trisodium phosphates/monosodium phosphates, carbonates, organic amines, etc. Sufficient amounts of the particular agent(s) are added to lower the pH and increase stability without significantly altering the preferred pH between 10 and 12 at working strength.

An advantage attributed to the silicate-based developers of this invention over current photopolymer plate developers is good pH stability. Accordingly, the storage life of the instant developer wherein the silica to caustic oxide ratio of 2.0 to 1 or more, is substantially improved. Greater pH stability is particularly advantageous in automatic processors which involve solution recirculation mechanism wherein the developer is exposed to atmospheric $CO_2$.

Another advantage resulting from use of the preferred alkali silicate developers disclosed herein is the significant improvement in oxidation protection of the support surface. Hence, the metal support surface, such as that disclosed in U.S. Ser. No. 731,733, U.S. Pat. No. 3,558,322 becomes more hydrophilic upon development with the preferred silicate-based solutions. More precisely, the preferred developers having respective silica to caustic oxide ratios in excess of 1.8 to 1 appreciably inhibit ink adherence in areas from which the photopolymer has been removed giving cleaner background areas. Said background refers to the printout quality of the plate having photopolymer completely removed therefrom. This undesirable ink adherence and subsequent transfer results from the oxidation produced by the developer on an oxidizable support such as untreated aluminum. Initial effort to counteract said oxidation problem involved application of a protective substratum having silica or some suitable antihalation agent therein prior to photopolymer coating. Such compositions are described in Plambeck, U.S. Pat. Nos. 2,760,863, 2,791,504, and 2,964,401; Alles, U.S. Ser. No. 560,889, filed June 27, 1966, U.S. Pat. No. 3,458,311 and Chambers, U.S. Ser. No. 688,703, filed Dec. 7, 1967, U.S. Pat. No. 3,479,185. In some instances, antihalation agents are included or applied in separate layers. Nevertheless, "-gumming" or immediate preinking treatment of the freshly developed photopolymerized surface is necessary to prevent oxidation. Commercial gum arabics are used for said "-gumming".

Hence, it is an advantage to effectively develop and protect photopolymer plates with the silicate-based solution disclosed herein. Accordingly, proper use of said silicate solutions results in oxidation protection and subsequent elimination of the "gumming" step.

Development of photopolymerized lithographic plates requires a solution treatment between 10 to 120 seconds and from 65° to 90° F. Though the plates may be sufficiently developed by mere soaking or immersing, mechanical and manual systems are more efficient. In such instances, the solution is applied by swabbing, brushing, jet spray or agitation within the developer container. Upon solution contact, the soluble unexposed areas of the photopolymer element are loosened. Single developer applications and subsequent washing have proven expedient. "Gumming" of the dried plate is not necessary.

This invention will be further illustrated by examples of photopolymerizable elements developed with the essential silicate-based solution and various modifications, disclosed herein. However, it is not intended that the scope of the present invention be limited to the examples.

EXAMPLE I

A free-radical photopolymerizable composition such as that described in Chang and Fan, U.S. Ser. No. 731,733, filed May 24, 1968, U.S. Pat. No. 3,558,322 wherein lophine dimers are combined with Michler's ketone (4,4'-bisdimethylaminobenzophenone), was coated on a grained aluminum plate. Said thoroughly mixed composition which was coated on brush grain AO aluminum or grained, non-treated aluminum comprised the following:

| Component | Quantity Added |
|---|---|
| Poly(methyl methacrylate/methacrylic acid) (90/10) | 300.0 g. |
| Trimethylolpropane triacrylate | 150.0 g. |
| 2-(o-chlorophenyl)-4,5-dimethoxyphenylimidazolyl dimer | 11.2 g. |
| Michler's ketone (4,4'-bisdimethylaminobenzophenone) | 6.0 g. |
| 2-Ethoxyethanol | 1,500.0 g |
| (Coating weights were about 35 to 45 $mg/dm^2$.) | |

The photopolymerizable plates were then dired and subjected to 26-second light exposure through a suitable image-bearing material. Exposures were made on standard equipment such as the carbon arc, NuArc "Flip-Top" Plate Maker, Model FT26L to the xenon light source. Several of the exposed plates were then developed in various alkali solutions. Solution compositions and respective identifications are as follows:

Developer 1—a silicate-based solution was prepared.

| Component | *Amount |
|---|---|
| Distilled water | 750 ml. |
| Diamond Chemical, Silicate of Soda Grade 34 (3.85 $SiO_2$:1 $Na_2O$) | 78 g. |
| 2-n-Butoxyethanol | 60 ml. |
| Triton X-100 (10% polyethylene glycol alkyl phenyl ether in water) | 2 ml. |
| Distilled water to make | 1 liter |
| (The pH was 11.0.) | |

*Dry weight of all silicates is approximately 25 g./l. of developer solution.

A phosphate solution similar to that disclosed in Alles, U.S. Ser. No. 560,889, was prepared. Said solution of pH 10.95 is henceforth identified as "B."

Several additional solutions comprising various alkaline agents, a common organic solvent and surfactant were prepared. Said solutions differed in alkaline agents only and are identified accordingly.

| Developer Solution | | Amount per Liter | Silica Caustic Oxide | pH |
|---|---|---|---|---|
| A | Borax | 25 g. | | 9.3 |
| 2 | Silicate of soda, silica to caustic oxide ratio 3.85:1 modified with 32 ml. 1N NaOH | 75 g. | 3.2:1 | 11.2 |
| 3 | Silicate of Soda | 57 g. | 2.0:1 | 12.0 |
| 4 | Anhydrous Sodium Metasilicate | 25 g. | 1:1 | 12.8 |
| 5 | Silicate of Soda | 29 g. | 1.5:1 | 12.7 |
| 6 | Silicate of Soda | 48 g. | 1.8:1 | 12.3 |

All silicates amounts are in aqueous solution. Solids=25 g./l. developer.

Several printing plates bearing the exposed photopolymer compositions were developed with each of the aforementioned solutions at 70° F. Said solutions were poured on the plates, allowed to react for 2 minutes, and the images produced by gently sponging the entire surfaces of the plates with developer. The plates were then rinsed with fresh water. Upon complete removal of the solubilized nonexposed and underexposed photopolymerizable layer and excess developer, the upper halves of the plates were "gummed" or treated with a commercial gum arabic composition. The untreated halves were dried. Each plate was mounted on a Heidelberg KOR single color offset press and prepared for printing. Black offset ink was used. Several prints from sample plates developed in the various solutions were compared for general printability.

On the gummed half of the plate, clean, sharp image transfers indicated suitable development and adequate ink adherence. Respective low-highlight and high-shadow dot percentages were visible on the developed plate. There was no undesired printing in the background. However, heavy "scumming" or undesirable background inking and printing occurred in the untreated areas of plates developed in the B (phosphate), A (Borax), and 4 (metasilicate solutions.) Though considerably less than 5, the defect was also evident on the untreated halves developed in the 6 silicate solution. In such instances, the areas became oxidized and more hydrophobic. But the "scumming" defects did not occur on prints made with plates developed in said 1, 2, and 3 silicate solutions.

The 1, 2, 3, and 6 solutions having respective silica to caustic oxide ratios of 3.85:1, 3.20:1, 2.0:1 and 1.8:1 provided oxidation protection and decreased oleophilicity thereon. Continuous development and comparative printability tests did not indicate "scumming". Only those solutions wherein silica to caustic oxide ratios were in excess of 1.5 yielded good protection. Hence, gumming was not necessary to obtain in excess of 5,000 good prints.

EXAMPLE II

Additional solutions comprising essentially the same ingredients of the 1 formulation in example I were prepared, except various grades of Du Pont Industrial and Biochemical lithium and potassium silicates were used as alkaline agents. Aliquot portions of the alkaline agents were admixed with distilled water and the organic solvents in the amounts disclosed in 1 of example I for 1 liter. Said solutions which were to have a pH value between 10 and 12 are identified as follows:

| Developer Solutions | Alkaline Agent | *Amount | Ratio S:02/ Li20 tm | pH |
|---|---|---|---|---|
| 7 | Lithium Silicate | 113 g. | 4.8:1 | 10.85 |
| 8 | Lithium Silicate | 118 g | 8.5:1 | 10.75 |
| 9 | Potassium Silicate | 85 g | 3.9:1 | 11.10 |
| 10 | Potassium Silicate | 67 g. | 3.2:1 | 11.20 |

*Dry weight basis: 25 g./l. developer solution

Exposed photopolymer bearing plates similar to that described in example I were developed as in Example I, by the lithium and potassium solutions, washed and prepared for printability tests. Printing operations set forth in example I were repeated. However, "gumming" was omitted.

Printability and background quality of plates developed herein were good. There was not scum after 2,000 consecutive prints. Said plates showed significant improvement in oxidation protection over those developed in silicate solutions having silica content less than that of caustic oxide.

EXAMPLE III

Various samples of the silicate solutions described in examples I and II wherein silica mole concentrations are 18 or above were prepared for stability tests. Since continuous $CO_2$ absorption ultimately affects solution alkalinity, tests were designed to monitor pH stability. Suitable 200 ml. beakers containing 100 ml. samples were stored and checked periodically. Since the solutions may normally be stored for several months in closed containers, the beakers were uncovered to facilitate exposure. Said beakers provided 38 cm.[2] exposure areas. The B solution such as that described in Alles, U. S. Ser. No. 560,889, U. S. Pat. No. 3,458,311 was the control. Where partial evaporation occurred, distilled water was added to the 100 ml. mark. Solutions were stirred and pH values taken. Results were charted.

DEVELOPER SOLUTIONS AND pH VALUES

| | A | B | 1 | 2 | 3 | 4 | 5 | 6 | 7 | 8 | 9 | 10 |
|---|---|---|---|---|---|---|---|---|---|---|---|---|
| Day: | | | | | | | | | | | | |
| 1 | 9.3 | 10.96 | 11.0 | 11.20 | 12.00 | 12.80 | 12.70 | 12.30 | 10.85 | 10.75 | 11.10 | 11.20 |
| 2 | 9.3 | 10.8 | 11.0 | 11.15 | 11.75 | 12.60 | 12.50 | 11.95 | 10.85 | 10.75 | 11.10 | 11.15 |
| 3 | 9.25 | 10.65 | 11.0 | 11.10 | 11.60 | 12.50 | 12.40 | 11.85 | 10.85 | 10.75 | 11.10 | 11.10 |
| 4 | 9.25 | 10.50 | 11.0 | 11.00 | 11.45 | 12.00 | 12.00 | 11.55 | | | 11.10 | 11.05 |
| 5 | | | | | | | | | | | 11.10 | 11.00 |
| 6 | | | | | | | | | 10.85 | 10.71 | | |
| 7 | 9.15 | 10.18 | 10.9 | 11.00 | 11.15 | 11.15 | 11.50 | 11.25 | 10.80 | 10.65 | | |
| 8 | 9.10 | 10.05 | 10.88 | 10.95 | 11.05 | 10.95 | 11.30 | 11.15 | | | | |
| Total decrease | 0.20 | 0.91 | 0.12 | 0.25 | 0.95 | 1.85 | 1.40 | 1.15 | 0.05 | 0.10 | 0.10 | 0.20 |

Some evaporation in all samples. However, rates of volatilization were not characteristic of particular compositions. But the chart indicates pH reduction occurred in those samples wherein silica to caustic oxide ratios were less than 2.1:1. Initial pH values or $OH^1$ concentrations of the B, 3, 4, 5, and 6 solutions were reduced by $CO_2$ absorption. This effect which decreases developer potential did not occur in the 1, 2, 7, 8, 9 and 10 solutions. Said solutions appreciably sustained high pH levels and are capable of storage in excess of six months. Also, the preferred silicates which have higher pH stability are useful for machine processing wherein greater aeration occurs.

The embodiments of the invention in which an exclusive property or privilege is claimed are defined as follows:

1. An aqueous developer solution for forming relief images in photopolymerizable layers containing at least one nongaseous addition polymerizable monomer having at least two terminal ethylenic groups and an organic macromolecular polymer binder for the monomer comprising essentially a soluble lithium, sodium or potassium metal silicate having a silica to alkali metal oxide ratio greater than 1.5 to 1 in an amount of at least 0.5 percent by weight per liter of solution, and at least one water-miscible organic solvent selected from the group consisting of low-molecular-weight aliphatic alcohols, ketones and ethers having a chain structure of one–four carbon atoms in addition to the functional groups in an amount between 2 and 25 percent by volume of the solution, said solution having a pH between 10.0 and 13.

2. A solution according to claim 1, wherein said silicate is a sodium silicate.

3. A solution according to claim 1, wherein said solvent is a 2-alkoxyethanol.

4. A solution according to claim 1, wherein said solvent is 2-ethoxyethanol.

5. A solution according to claim 1, wherein said solvent is 2-n-butoxyethanol.

6. A solution according to claim 1 containing a small amount of polyethylene glycol alkyl phenyl ether.